US010032750B2

(12) United States Patent
Deligianni et al.

(10) Patent No.: US 10,032,750 B2
(45) Date of Patent: *Jul. 24, 2018

(54) INTEGRATED DC-DC POWER CONVERTERS THROUGH FACE-TO-FACE BONDING

(71) Applicant: International Business Machines Corporation, Armonk, NY (US)

(72) Inventors: Hariklia Deligianni, Alpine, NJ (US); Devendra K. Sadana, Pleasantville, NY (US); Edmund J. Sprogis, Myrtle Beach, SC (US); Naigang Wang, Ossining, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/196,884

(22) Filed: Jun. 29, 2016

(65) Prior Publication Data

US 2018/0005988 A1   Jan. 4, 2018

(51) Int. Cl.
*H01L 23/48* (2006.01)
*H01L 25/065* (2006.01)
(Continued)

(52) U.S. Cl.
CPC ...... *H01L 25/0657* (2013.01); *H01L 21/4853* (2013.01); *H01L 21/8238* (2013.01);
(Continued)

(58) Field of Classification Search
CPC ....... H01L 2224/16145; H01L 29/2003; H01L 29/66462; H01L 29/778; H01L 29/66431;
(Continued)

(56) References Cited

U.S. PATENT DOCUMENTS 7,772,055 B2    8/2010   Germain et al.
8,994,115 B2    3/2015   Korec et al.
(Continued)

FOREIGN PATENT DOCUMENTS

WO    WO2015042199 A1    3/2015

OTHER PUBLICATIONS

Shenai et al., "Efficient integrated DC-DC power converters—Advanced technologies and new challenges," IEEE EnergyTech 2011 Conference, pp. 1-6 (May 2011).
(Continued)

*Primary Examiner* — Khiem D Nguyen
(74) *Attorney, Agent, or Firm* — Vazken Alexanian; Michael J. Chang, LLC

(57) ABSTRACT

DC-DC power converters with GaN switches, magnetic inductors and CMOS power drivers integrated through face-to-face wafer bonding techniques are provided. In one aspect, an integrated DC-DC power converter includes: a Si CMOS chip having at least one Si CMOS transistor formed thereon; a GaN switch chip, bonded to the Si CMOS chip in a face-to-face manner, having at least one GaN transistor formed thereon; and an on-chip magnetic inductor present either on the Si CMOS chip or on the GaN switch chip. A method of forming an integrated DC-DC power converter is also provided.

19 Claims, 7 Drawing Sheets

(51) Int. Cl.
  *H01L 27/092* (2006.01)
  *H01L 21/8238* (2006.01)
  *H01L 21/48* (2006.01)
  *H01L 49/02* (2006.01)

(52) U.S. Cl.
  CPC ............ *H01L 27/092* (2013.01); *H01L 28/10* (2013.01); *H01L 2225/06513* (2013.01); *H01L 2225/06541* (2013.01)

(58) Field of Classification Search
  CPC ....... H01L 2924/13064; H01L 25/0657; H01L 2224/48145; H01L 23/49838; H01L 23/5227
  See application file for complete search history.

(56) References Cited

U.S. PATENT DOCUMENTS

| | | |
|---|---|---|
| 9,147,701 B2 | 9/2015 | Saunders |
| 9,154,045 B2 | 10/2015 | Saunders et al. |
| 9,209,683 B2 | 12/2015 | Kalnitsky |
| 9,654,004 B1* | 5/2017 | Deligianni ............ H02M 3/158 |
| 2006/0175627 A1 | 8/2006 | Shiraishi |
| 2008/0211105 A1* | 9/2008 | Lin ........................ H01L 24/11 |
| | | 257/762 |
| 2011/0284818 A1* | 11/2011 | Avouris ................. B82Y 10/00 |
| | | 257/9 |
| 2013/0043940 A1 | 2/2013 | Hebert et al. |
| 2013/0074907 A1* | 3/2013 | Saunders .............. H01L 27/142 |
| | | 136/249 |
| 2014/0192441 A1 | 7/2014 | Briere et al. |
| 2014/0216943 A1* | 8/2014 | Fontana, Jr. ........... C25D 7/123 |
| | | 205/170 |
| 2014/0266460 A1 | 9/2014 | Nobbe et al. |
| 2015/0069523 A1* | 3/2015 | Or-Bach ............. H01L 25/0657 |
| | | 257/390 |

OTHER PUBLICATIONS

Long et al., "A 10-MHz resonant gate driver design for LLC resonant DC-DC converters using GaN devices," 2014 IEEE Applied Power Electronics Conference and Exposition (APEC), pp. 2093-2097 (Mar. 2014).

Lee et al., "Fabrication and Analysis of High-Performance Integrated Solenoid Inductor with Magnetic Core," IEEE Transactions on Magnetics, vol. 44, issue 1, pp. 4089-4095 (Nov. 2008).

Zhuang et al., "Study of Magnetic On-Chip Inductors," Proc. SAFE 2001, Nov. 28-29, 2001, Veldhoven, the Netherlands, pp. 229-233.

* cited by examiner

FIG. 17
FIG. 18
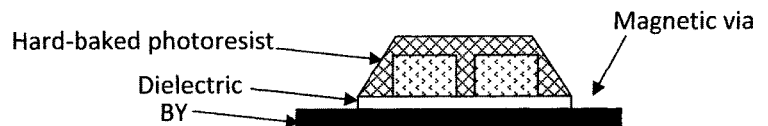
FIG. 19
FIG. 20

US 10,032,750 B2

INTEGRATED DC-DC POWER CONVERTERS THROUGH FACE-TO-FACE BONDING

FIELD OF THE INVENTION

The present invention relates to direct current (DC)-DC power converters, and more particularly, to integrated DC-DC power converters with gallium nitride (GaN) switches, magnetic inductors and complementary metal-oxide semiconductor (CMOS) power drivers integrated through face-to-face wafer bonding techniques.

BACKGROUND OF THE INVENTION

A switched-inductor power converter is the most widely used DC-DC power converter topology in power electronics due to its high efficiency and power-handling ability. A Buck DC-DC power converter can be used to step down voltage from its input/supply to its output/load, and thus are also referred to as step-down converters. An inductor is used in a Buck converter to store energy and two switches are used to control the currents flowing in the inductors.

It is desirable for DC-DC power converters to work at high voltages (e.g., greater than 20 volts (V), high power density, and high frequencies (e.g., greater than 10 megahertz (MHz)), while also providing efficient power delivery and fast transient response. The switches for DC-DC power converters are typically silicon (Si)-based devices, such as CMOS devices for low voltage (e.g., less than 5V) and discrete Si-trench devices for higher voltage (up to 50V). However, Si devices have high on-resistance (Ron) and gate capacitance (Cg), which make it challenging to achieve high switching frequency and high power density. At the same time, low frequency requires larger passive devices (e.g., inductors), thereby necessitating a larger converter size and slower transient response.

High-electron-mobility-transistors (HEMTs), such as GaN transistors, have high breakdown voltage, low on-resistance, and high operation temperature, which makes them ideal candidates to replace Si devices as the switches for high power, high voltage Buck converters. Meanwhile, on-chip magnetic inductors (closed yoke inductors or solenoidal inductors) can provide the dense energy storage required for integrated power converters to achieve the high level integration for high efficiency power delivery and fast transient response.

Currently, the GaN transistor-based power converters use discrete parts, such as a GaN switch chip, a Si CMOS chip and discrete inductors, which are then assembled on a printed circuit Board. This non-integrated structure has a large size, large parasitics, limited switching frequency, and low efficiency.

Thus, DC-DC power converter designs with fully integrated components would be desirable.

SUMMARY OF THE INVENTION

The present invention provides integrated DC-DC power converters with gallium nitride (GaN) switches, magnetic inductors and complementary metal-oxide semiconductor (CMOS) power drivers integrated through face-to-face wafer bonding techniques. In one aspect of the invention, an integrated DC-DC power converter is provided. The DC-DC power converter includes: a Si CMOS chip having at least one Si CMOS transistor formed thereon; a GaN switch chip, bonded to the Si CMOS chip in a face-to-face manner, having at least one GaN transistor formed thereon; and an on-chip magnetic inductor present either on the Si CMOS chip or on the GaN switch chip.

In another aspect of the invention, a method of forming an integrated DC-DC power converter is provided. The method includes: forming at least one Si CMOS transistor on an Si CMOS chip; forming at least one GaN transistor on a GaN switch chip; forming an on-chip magnetic inductor on either the Si CMOS chip or on the GaN switch chip; and bonding the Si CMOS chip to the GaN switch chip in a face-to-face manner.

A more complete understanding of the present invention, as well as further features and advantages of the present invention, will be obtained by reference to the following detailed description and drawings.

BRIEF DESCRIPTION OF THE DRAWINGS

FIG. 17 is a cross-sectional diagram illustrating a starting structure for fabricating a magnetic inductor on the TSV interposer or GaN transistor chip, which includes a bottom yolk (BY) and a dielectric over the BY according to an embodiment of the present invention;

FIG. 18 is a cross-sectional diagram illustrating Cu wires having been plated onto the dielectric according to an embodiment of the present invention;

FIG. 19 is a cross-sectional diagram illustrating the Cu wires having been covered with a hard baked photoresist, and magnetic vias having been opened to the BY according to an embodiment of the present invention; and FIG. 20 is a cross-sectional diagram illustrating a top yolk TY of the magnetic inductor having been formed according to an embodiment of the present invention.

DETAILED DESCRIPTION OF PREFERRED EMBODIMENTS

Provided herein are face-to-face bonding techniques for fabricating on-chip DC-DC power converters with fully integrated GaN switches, magnetic inductors and CMOS power drivers. More specifically, CMOS transistors are integrated on a Si substrate, and this Si CMOS chip is then bonded to a GaN switch chip through face-to-face bonding to form a complete compact DC-DC power converter, while magnetic inductors are built on either the Si substrate or the GaN chip. Some notable advantages of the present techniques include: smaller converter size, high efficiency (smaller $R*I^2$ loss from interconnect and bonding wires, wherein R is resistance and I is current), low noise (smaller parasitics from interconnect and bonding wires), fast transient response, and low cost.

Several exemplary embodiments are provided below for forming the present fully integrated DC-DC power converters wherein a face-to-face bonding process is employed to integrate the Si CMOS chip with the GaN switch chip. In each of the following examples, the process for forming the Si CMOS chip is described, followed by a description of the process for forming the GaN switch chip, and then finally a description of the (face-to-face) chip bonding used to integrate the Si CMOS and GaN chips. This sequence is used to clearly illustrate the various steps involved in each process. However, the presentation in this manner does not imply that the steps have to be performed in the order described. For instance, one or more of the steps may be performed in a different order than presented and/or two or more steps may be performed simultaneously. For instance, one or more of the steps involved in producing the Si CMOS and GaN chips may be performed simultaneously, followed by face-to-face chip bonding to complete the integrated structure.

Figure 1:
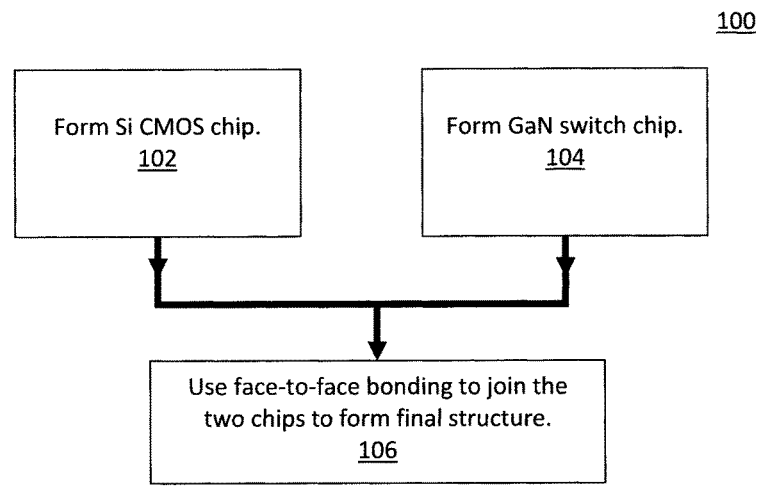
FIG. 1 is a diagram illustrating an overview of the present techniques for forming a fully integrated DC-DC power converter using face-to-face chip bonding techniques according to an embodiment of the present invention.

Methodology 100 of FIG. 1 provides a general overview of the present process. In step 102, the Si CMOS chip is fabricated. In step 104, the GaN switch chip is fabricated. And in step 106, face-to-face bonding is used to join the Si CMOS and GaN chips together forming the present fully integrated DC-DC power converter design. In the examples provided below, the magnetic inductor can be placed on either the Si CMOS or the GaN switch chip.

A first exemplary embodiment is now described by way of reference to FIGS. 2-7. In this case, the magnetic inductor is constructed on the GaN switch chip, and the Si CMOS and GaN chips are joined together in a face-to-face manner via solder bump interconnects.

Figure 2:
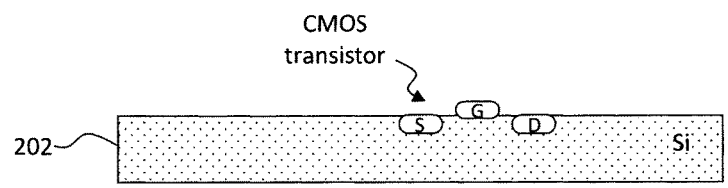
FIG. 2 is a cross-sectional diagram illustrating at least one CMOS transistor having been fabricated in a Si CMOS chip according to an embodiment of the present invention.

Fabrication of the Si CMOS chip begins as shown in FIG. 2 with a Si substrate 202 in which one or more CMOS transistors are formed using standard front-end-of-line (FEOL) processes. These CMOS transistors will serve as the CMOS power drivers in the completed integrated DC-DC power converter. For illustrative purposes only, a single (CMOS) power driver is shown in the figures. Multiple power drivers may, however, be employed in the same manner as described herein.

As shown in FIG. 2, each transistor fabricated herein generally includes a source (S), a drain (D), and a gate (G). The source (S) and drain (D) are interconnected by a channel. The gate (G) regulates current flow through the channel.

Figure 3:
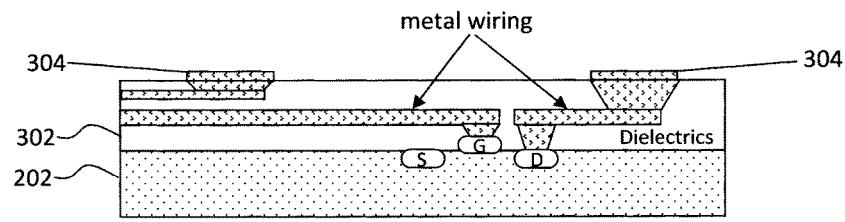
FIG. 3 is a cross-sectional diagram illustrating metal wiring having been fabricated for connecting the CMOS transistor to the GaN switches and to the magnetic inductor according to an embodiment of the present invention.

As shown in FIG. 3, standard metallization processes are then used to fabricate metal wiring that will ultimately connect the Si CMOS transistor(s) to the GaN switches and to the magnetic inductor, while permitting face-to-face bonding of the chips. Namely, by implementing face-to-face bonding schemes, the front of the Si CMOS chip is bonded (via wafer bonding processes) to the front of the GaN switch chip. Advantageously, this configuration does not require any connections through the substrate 202 (such as through-silicon vias or TSVs) since the bonding will occur at the front face of each wafer.

To enable face-to-face bonding, a dielectric 302 is deposited onto the substrate 202, covering the Si CMOS transistor(s). The dielectric 302 can then be patterned, and the pattern filled with a suitable conductor (e.g., copper (Cu)) to form the metal wiring. While dielectric 302 is shown as a single layer, it would be apparent to one skilled in the art that multiple layers of dielectric may be needed to bury the various metal wiring layers. Finally, bond pads 304 can be formed on the dielectric 302 in contact with the metal wiring. By way of example only, the bond pads can be formed from a suitable metal such as Cu. As will be described in detail below, these bond pads, along with corresponding bond pads on the GaN switch chip will be used to integrate the two chips via a solder bond between the bond pads. Thus, these bond pads 304 on the Si CMOS chip may also be referred to herein as a first set of bond pads, with the corresponding bond pads on the GaN switch chip being the second set of bond pads.

Figure 4:
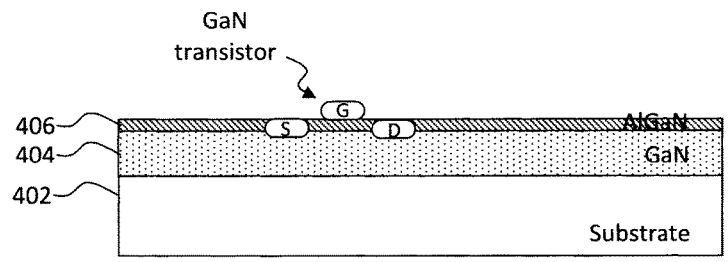
FIG. 4 is a cross-sectional diagram illustrating at least one GaN transistor switch having been formed on the GaN switch chip according to an embodiment of the present invention.

Fabrication of the GaN switch chip begins as shown in FIG. 4 with a substrate 402 and an active layer on the substrate 402 in which one or more GaN transistor switches are formed. Suitable substrates 402 for a GaN switch chip include, but are not limited to, Si (111), silicon carbide (SiC), or sapphire substrates.

Techniques for forming a GaN transistor are described, for example, in U.S. Pat. No. 7,772,055 issued to Germain et al., entitled "AgGaN High Electron Mobility Transistor Devices" (hereinafter "U.S. Pat. No. 7,772,055"), the contents of which are incorporated by reference as if fully set forth herein. GaN transistors generally include as the active materials a layer of GaN 404 on the substrate 402, and a layer of a material 406 having a higher band gap than GaN on the GaN layer 404. See FIG. 4. By way of example only, suitable higher band gap materials for layer 406 include, but are not limited to, aluminum gallium nitride (AlGaN). As described, e.g., in U.S. Pat. No. 7,772,055, these layers 404 and 406 can be formed on the substrate 402 using a vapor phase epitaxy process with trimethylgallium, trimethyl ammonium, ammonia, and silane as precursors.

Figure 5:
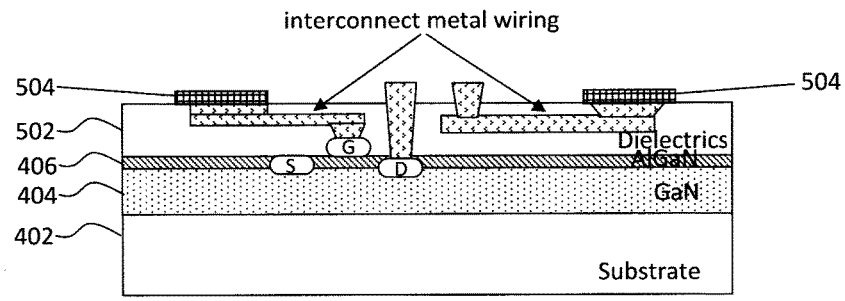
FIG. 5 is a cross-sectional diagram illustrating interconnect metal wiring having been formed to the GaN transistor switch according to an embodiment of the present invention.
Figure 6:
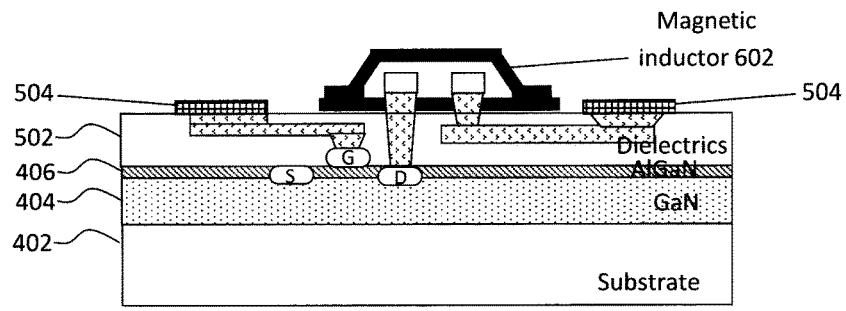
FIG. 6 is a cross-sectional diagram illustrating a magnetic inductor having been built on the GaN switch chip according to an embodiment of the present invention.
Figure 7:
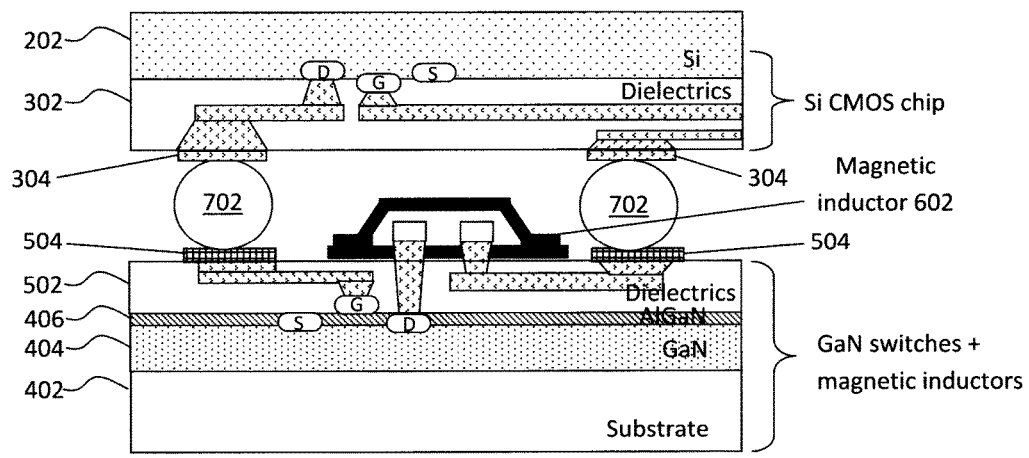
FIG. 7 is a cross-sectional diagram illustrating the Si CMOS and GaN switch chips having been bonded together in a face-to-face manner according to an embodiment of the present invention.

In the same manner as described above, each GaN transistor switch will have a source (S), a drain (D), and a gate (G), formed here on the active layers 404 and 406. As shown in FIG. 5, interconnect metal wiring is then formed to the GaN transistor switches. As detailed above, forming the interconnect metal wiring involves first depositing a dielectric(s) 502 on the wafer over the GaN transistor switches, forming a metallization pattern in the dielectric 502, and then filling the pattern with a suitable metal such as Cu. As shown in FIG. 5, a second set of bond pads 504 is then formed to the interconnect metal wiring. As described above, these (second) bond pads 504 correspond to the (first) bond pads 304 on the Si CMOS wafer and will be used to bond the wafers together (in a face-to-face manner).

In this example, the magnetic inductor 602 is built on (a front surface of) the GaN switch chip. See FIG. 6. A switched mode DC-DC power converter converts DC voltage from one level to another by storing the input energy temporarily, and then releasing that energy at a different voltage. The storage and release may be made from a magnetic field of the magnetic inductor. In the example depicted in the figures, the magnetic inductor has a closed-yoke design. An exemplary process for forming a closed-yoke magnetic inductor is described in detail below. Other magnetic inductor designs may also be implemented in accordance with the present techniques, such as solenoidal inductors (which have one magnetic layer instead of the two magnetic layers present in a closed-yoke design). See, for example, Lee et al., "Fabrication and Analysis of High-Performance Integrated Solenoid Inductor with Magnetic Core," IEEE Transactions on Magnetics, vol. 44, issue 1, pgs. 4089-4095 (November 2008), the contents of which are incorporated by reference as if fully set forth herein.

Solder bumps 702 are then formed on either the (first) bond pads 304 or the (second) bond pads 504, and the Si CMOS chip and the GaN switch chip are then bonded in a face-to-face manner via a solder bond between the bond pads 304 and 504. See FIG. 7. Namely, to enable this face-to-face bonding, one of the chips (in this example the Si CMOS chip) is flipped such that the fronts of the Si CMOS and GaN switch chips are facing one another, and such that the solder bumps 702 can interconnect the two chips.

Figure 8:
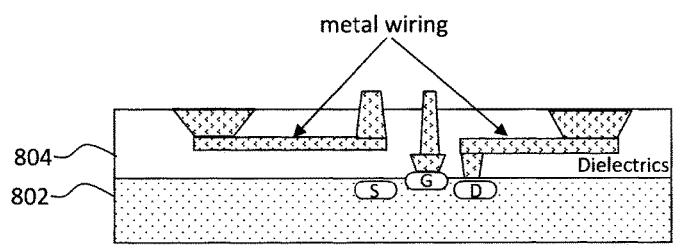
FIG. 8 is a cross-sectional diagram illustrating, according to an alternate embodiment, a Si CMOS chip having been fabricated which includes at least one CMOS transistor and metal wiring according to an embodiment of the present invention.

It also possible to employ a face-to-face bonding scheme where the magnetic inductor is formed on the Si CMOS chip. See, for example, FIGS. 8-11. Namely, as shown in FIG. 8, in the same manner as described above, fabrication of the Si CMOS chip begins with an Si substrate 802 in which one or more CMOS transistors (i.e., power drivers) are formed, each having a source (S), a drain (D), a gate (G), and a channel interconnecting the source (S) and drain (D).

A dielectric 804 is then deposited onto the substrate 802, covering the Si CMOS transistor(s). The dielectric 804 is patterned, and the pattern filled with a suitable conductor (e.g., copper (Cu)) to form metal wiring in the dielectric.

Figure 9:
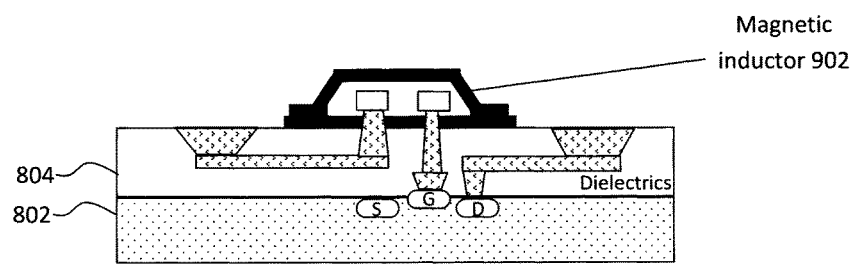
FIG. 9 is a cross-sectional diagram illustrating a magnetic inductor having been built on the Si CMOS ship according to an embodiment of the present invention.

In this example, a magnetic inductor 902 is built on (a front surface of) the Si CMOS chip. See FIG. 9. While a closed-yoke magnetic inductor is shown in FIG. 9, as provided above, a variety of different magnetic inductor designs, such as solenoidal inductors, can be employed in accordance with the present techniques.

Figure 10:
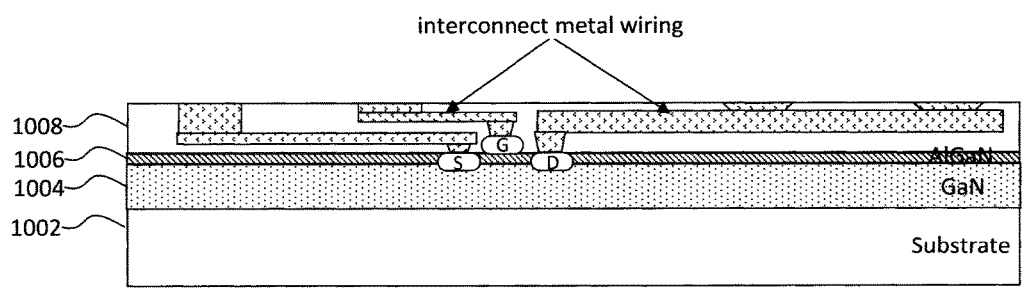
FIG. 10 is a cross-sectional diagram illustrating a GaN switch chip having been fabricated which includes at least one GaN transistor switch formed in an active layer according to an embodiment of the present invention.

A GaN switch chip is then fabricated in the same manner as described above, except that in this case the magnetic inductor is not formed on the GaN switch chip. Namely, as shown in FIG. 10, the fabrication of the GaN switch chip begins with a substrate 1002 (e.g., Si (111), SiC, or sapphire substrate) and an active layer on the substrate 1002 in which one or more GaN transistor switches are formed, each having a source (S), a drain (D), a gate (G), and a channel interconnecting the source (S) and drain (D). According to an exemplary embodiment, the active layer includes a layer of GaN 1004 on the substrate 1002, and a layer of a material 1006 having a higher band gap than GaN (such as AlGaN) on the GaN layer 1004.

In the same manner as described above, interconnect metal wiring is then formed to the GaN transistor switches which involves first depositing a dielectric(s) 1008 on the wafer over the GaN transistor switches, forming a metallization pattern in the dielectric 1008, and then filling the pattern with a suitable metal such as Cu. See FIG. 10.

Solder bumps 1102 are then formed on the front side of either the Si CMOS chip metal wiring or the GaN switch chip interconnect metal wiring, and the Si CMOS chip and the GaN switch chip are then bonded in a face-to-face manner via the solder bumps 1102. See FIG. 11. To enable this face-to-face bonding, one of the chips (in this example the Si CMOS chip) is flipped such that the fronts of the Si CMOS and GaN switch chips are facing one another, and such that the solder bumps 1102 can interconnect the two chips.

Figure 11:
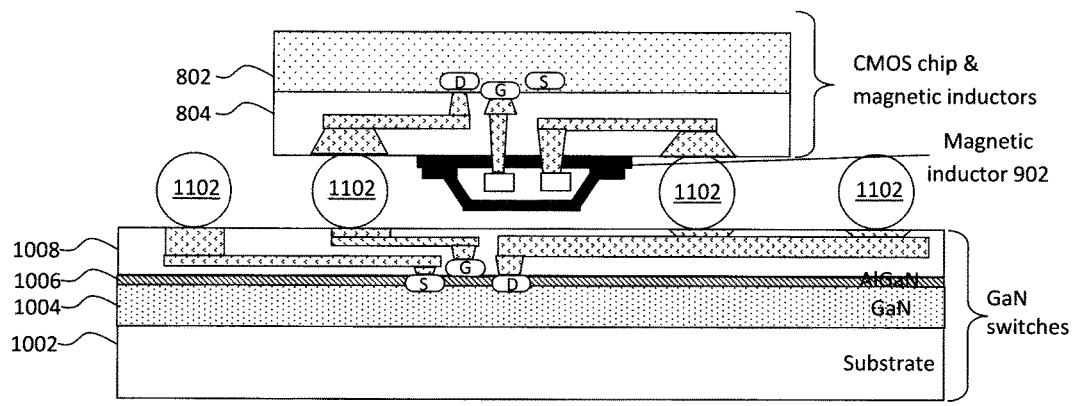
FIG. 11 is a cross-sectional diagram illustrating the Si CMOS and GaN switch chips having been bonded together in a face-to-face manner according to an embodiment of the present invention.
Figure 12:
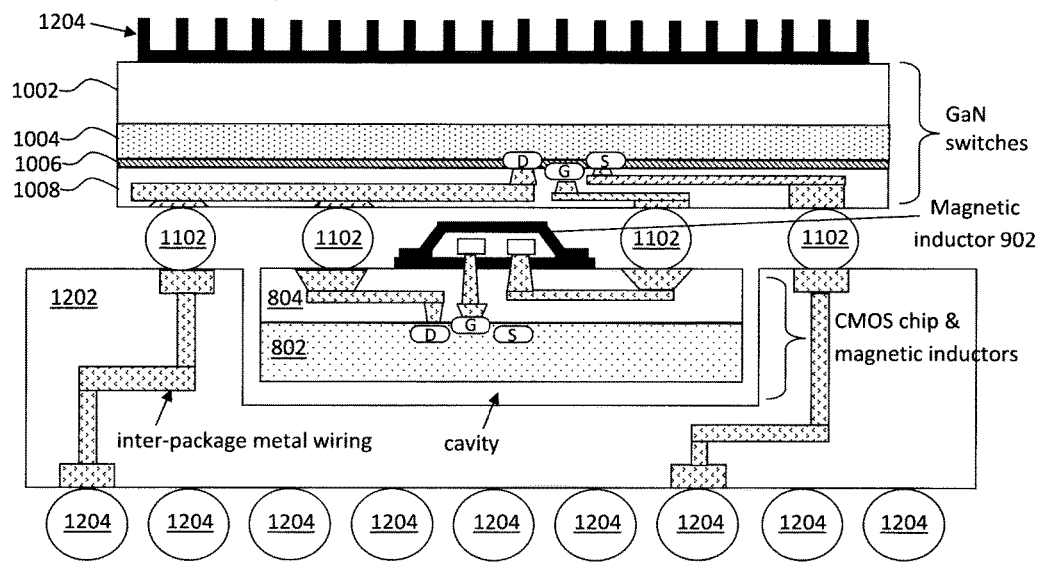
FIG. 12 is a cross-sectional diagram illustrating the present fully integrated DC-DC power converter structures having been integrated with a chip package and optional heat sink according to an embodiment of the present invention.

Using the face-to-face bonded structure of FIG. 11 merely as an example, FIG. 12 illustrates how the present fully integrated DC-DC power converter structures can be integrated with a chip package and optional heat sink. It is notable that any of the DC-DC power converter structures can be packaged in this manner.

Specifically, as shown in FIG. 12, the package 1202 used has a cavity therein of a dimension configured to receive one of the chips (in this case the Si CMOS chip having a magnetic inductor). The package in this example is illustrative of a ball grid array (or BGA) package having a plurality of solder bumps 1204. By arranging one of the chips in the converter structure in the cavity, the solder bumps 1102 bonding the chips together can also be leveraged to make connections with inter-packaging metal wiring to the solder bumps 1204 of the BGA.

As shown in FIG. 12, a heat sink 1204 may also be employed in the packed device. As is known in the art, a heat sink serves to remove heat from the device during operation. The heat sink shown in the present example is a fin-based heat sink. However, any suitable heat sink designs known in the art may be implemented in the converter package-level design. Here, the backside of the GaN switch chip provides a convenient location for the heat sink. However, a heat sink may be employed on any available surface of the packaged device.

Rather than solder bonds, it is also possible to utilize metal-metal bonds to integrate the chips. See, for example, FIGS. 13-17. As described above, (e.g., Cu) bond pads can be formed on the Si CMOS and GaN switch chips. Metal-metal bonds between these bond pads can be formed to integrate the chips. Cu—Cu bonds, for instance, can be formed using standard thermocompressive bonding tools and techniques known in the art.

Figure 13:
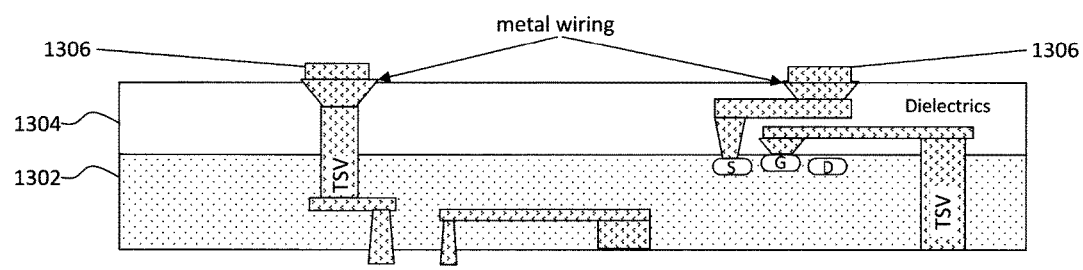
FIG. 13 is a cross-sectional diagram illustrating, according to another alternate embodiment, a Si CMOS chip having been fabricated which includes at least one CMOS transistor, through silicon vias (TSVs), and metal wiring according to an embodiment of the present invention.

The process flow is generally the same as above. Namely, as shown in FIG. 13, fabrication of the Si CMOS chip begins with an Si substrate 1302 in which one or more CMOS transistors (i.e., power drivers) are formed, each having a source (S), a drain (D), a gate (G), and a channel interconnecting the source (S) and drain (D). In this example, the magnetic inductor will be built, post (face-to-face) wafer bonding, on the backside of the Si COMS wafer. Thus, connections between the CMOS transistors and the magnetic inductor are provided by way of one or more through silicon vias (or TSVs) which are now formed in the substrate 1302. See FIG. 13.

A dielectric 1304 is then deposited onto the substrate 1302, covering the Si CMOS transistor(s). The dielectric 1304 is patterned, and the pattern filled with a suitable conductor (e.g., Cu) to form metal wiring in the dielectric. The metal wiring, in conjunction with the TSVs, will interconnect the CMOS transistors and magnetic inductor with the GaN switches.

Finally, bond pads 1306 can be formed on the dielectric 1304 in contact with the metal wiring. By way of example only, the bond pads can be formed from a suitable metal such as Cu. As will be described in detail below, these bond pads, along with corresponding bond pads on the GaN switch chip will be used to integrate the two chips via a metal-to-metal bond between the bond pads. Thus, these bond pads 1306 on the Si CMOS chip may also be referred to herein as a first set of bond pads, with the corresponding bond pads on the GaN switch chip being the second set of bond pads.

Figure 14:
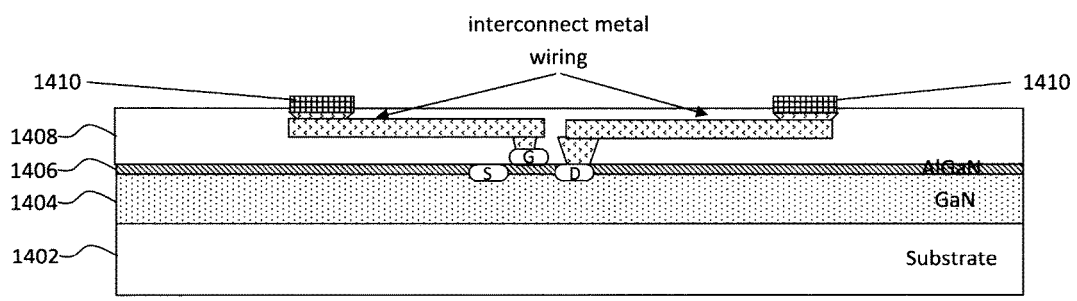
FIG. 14 is a cross-sectional diagram illustrating a GaN switch chip having been fabricated which includes at least one GaN transistor switch formed in an active layer according to an embodiment of the present invention.
Figure 15:
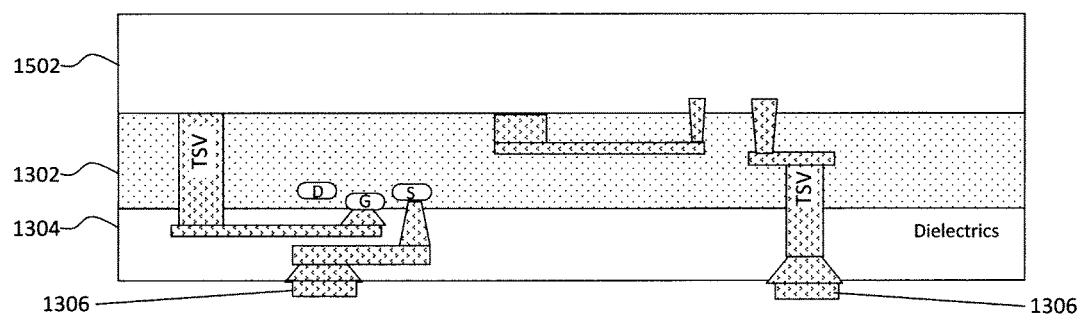
FIG. 15 is a cross-sectional diagram illustrating a temporary handle wafer having been attached to the backside surface of the Si CMOS chip to facilitate bonding according to an embodiment of the present invention.

A GaN switch chip is then fabricated in the same manner as described above. Namely, as shown in FIG. 14, the fabrication of the GaN switch chip begins with a substrate 1402 (e.g., Si (111), SiC, or sapphire substrate) and an active layer on the substrate 1402 in which one or more GaN transistor switches are formed, each having a source (S), a drain (D), a gate (G), and a channel interconnecting the source (S) and drain (D). According to an exemplary embodiment, the active layer includes a layer of GaN 1404 on the substrate 1402, and a layer of a material 1406 having a higher band gap than GaN (such as AlGaN) on the GaN layer 1404.

In the same manner as described above, interconnect metal wiring is then formed to the GaN transistor switches which involves first depositing a dielectric(s) 1408 on the wafer over the GaN transistor switches, forming a metallization pattern in the dielectric 1408, and then filling the pattern with a suitable metal such as Cu. See FIG. 14.

As shown in FIG. 14, a second set of bond pads 1410 is then formed to the interconnect metal wiring. These (second) bond pads 1410 correspond to the (first) bond pads 1306 on the Si CMOS wafer and will be used to bond the wafers together (in a face-to-face manner).

Prior to bonding, it may be preferable to attach a temporary handle wafer 1502 to the backside face of the Si CMOS chip to facilitate the metal-metal bond between the chips. See FIG. 15. It is notable that metal-metal bonding is a wafer-level process while solder bump bonding (as in the examples above is a die-level process). Further, wafers with TSVs are typically very thin and thus need a handle wafer to do the wafer-level metal-metal bonding.

Figure 16:
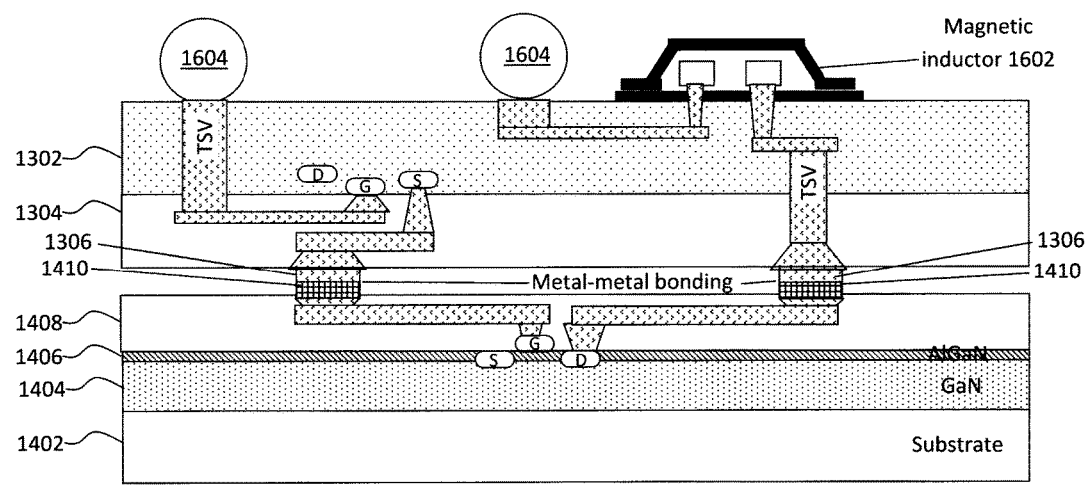
FIG. 16 is a cross-sectional diagram illustrating the Si CMOS and GaN switch chips having been bonded together in a face-to-face manner according to an embodiment of the present invention.

As shown in FIG. 16, the Si CMOS chip and the GaN switch chip are then bonded in a face-to-face manner via a metal-metal bond between the first bond pads 1306 and the second bond pads 1410. To enable this face-to-face bonding, one of the chips (in this example the Si CMOS chip) is flipped such that the fronts of the Si CMOS and GaN switch chips are facing one another, aligning the bond pads 1306 and 1410. Cu—Cu bonds, for instance, between the bond pads 1306 and 1410 can be formed using standard thermocompressive bonding tools and techniques known in the art. Following bonding, the temporary handle wafer 1502 can be removed.

A magnetic inductor 1602 is then built on (a back surface of) the Si CMOS chip. See FIG. 16. Further back end of line (BEOL) processing can also be performed, such as the placement of solder bumps 1604.

An exemplary methodology for fabricating a closed-yoke magnetic inductor is now provided by way of reference to FIGS. 17-20. In the above examples, the magnetic inductor was formed on either the TSV interposer chip or the GaN transistor chip. Thus, either of these chips are represented generically in FIGS. 17-20 as a substrate on which the magnetic inductor is built. As shown in FIG. 17, a film of a magnetic material is formed on the substrate. This film will be used to form the bottom yolk or BY. See FIG. 17. Suitable magnetic materials for the bottom (and top) yolk include, but are not limited to, iron (Fe)-based materials, such as iron-tantalum nitride (FeTaN), iron-hafnium oxide (FeHfO), iron-chromium hafnium nitride (FeCrHfN), iron-chromium tantalum nitride (FeCrTaN), iron-chromium nitride (FeCrN), iron-cobalt boron (FeCoB), and combinations thereof. See, for example, Zhuang et al., "Study of Magnetic On-Chip Inductors," Proc. SAFE 2001, Nov. 28-29, 2001, Veldhoven, the Netherlands, pp. 229-233, the contents of which are incorporated by reference as if fully set forth herein. Magnetic materials for the bottom yolk can be deposited onto the substrate using a technique such as sputtering. After deposition, the magnetic film for the bottom yolk is patterned using standard lithography and etching techniques into the footprint and location of the magnetic inductor. See FIG. 17. A dielectric is then deposited onto the bottom yolk BY.

Cu wires are then plated onto the dielectric. See FIG. 18. By way of example only, a standard resist mask plating technique can be used to form the Cu wires, wherein a conventional photolithography and etching process is used to pattern a photoresist (not shown) on the dielectric with the footprint and location of the Cu wires. The photoresist pattern is coated with a thin Cu seed layer (not shown), e.g., by sputtering, which is needed to enable plating of the Cu wires. The pattern is then filled with plated Cu to form the Cu wires, followed by removal of the photoresist and seed Cu layer.

As shown in FIG. 19, the Cu wires are then covered with a patterned (e.g., hard baked) photoresist which is then used as a mask to open up the dielectric, forming magnetic vias to the bottom yolk BY. In the same manner as described above for the bottom yolk BY, a suitable magnetic material (see above) is deposited and patterned to form the top yolk (TY) of the magnetic inductor. See FIG. 20.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. An integrated DC-DC power converter, comprising:
   a silicon complementary metal-oxide semiconductor (Si CMOS) chip comprising at least one Si CMOS transistor formed thereon and a first dielectric on a front of the Si CMOS chip covering the at least one Si CMOS transistor;
   a gallium nitride (GaN) switch chip comprising at least one GaN transistor formed thereon and a second dielectric on a front of the GaN switch chip covering the at least one GaN transistor, wherein the GaN switch chip is bonded to the Si CMOS chip with the front of the GaN switch chip facing the front of the Si CMOS chip; and an on-chip magnetic inductor present either on the Si CMOS chip or on the GaN switch chip in between the front of the GaN switch chip and the front of the Si CMOS chip.

2. The integrated DC-DC power converter of claim 1, wherein the GaN switch chip is bonded to the Si CMOS chip via a solder bond, wherein the solder bond creates a space between the front of the GaN switch chip and the front of the Si CMOS chip, and wherein the on-chip magnetic inductor is present within the space.

3. The integrated DC-DC power converter of claim 1, wherein the on-chip magnetic inductor is present on the Si CMOS chip.

4. The integrated DC-DC power converter of claim 3, wherein the on-chip magnetic inductor is present on the front of the Si CMOS chip.

5. The integrated DC-DC power converter of claim 1, wherein the on-chip magnetic inductor is present on the GaN switch chip.

6. The integrated DC-DC power converter of claim 5, wherein the on-chip magnetic inductor is present on the front of the GaN switch chip.

7. The integrated DC-DC power converter of claim 1, wherein the Si CMOS chip further comprises a first set of bond pads, and wherein the GaN switch chip comprises a second set of bond pads.

8. The integrated DC-DC power converter of claim 7, wherein the Si CMOS chip further comprises:
   a substrate on which the at least one Si CMOS transistor is formed;
   the first dielectric on the substrate covering the at least one Si CMOS transistor; and
   a metal wiring in the first dielectric connecting the at least one Si CMOS transistor with the first set of bond pads.

9. The integrated DC-DC power converter of claim 7, wherein the GaN switch chip further comprises:
   a substrate;
   an active layer on the substrate on which the at least one GaN transistor is formed;
   the second dielectric over the at least one GaN transistor; and
   an interconnect metal wiring in the second dielectric that connects the at least one GaN transistor to the second set of bond pads.

10. The integrated DC-DC power converter of claim 9, wherein the active layer comprises a first active material on the substrate, and a second active material on the first active material.

11. The integrated DC-DC power converter of claim 10, wherein the first active material comprises GaN, and wherein the second active material has a higher band gap than the first active material.

12. The integrated DC-DC power converter of claim 11, wherein the second active material comprises aluminum-gallium-nitride (AlGaN).

13. The integrated DC-DC power converter of claim 1, further comprising:
   a chip package, wherein the chip package has a cavity in which the GaN switch chip or the Si CMOS chip is positioned.

14. The integrated DC-DC power converter of claim 8, wherein the on-chip magnetic inductor is present on the front of the Si CMOS chip, and wherein the metal wiring in the first dielectric connects the at least one Si CMOS transistor to the on-chip magnetic inductor.

15. The integrated DC-DC power converter of claim 9, wherein the on-chip magnetic inductor is present on the front of the GaN switch chip, and wherein the interconnect metal wiring in the second dielectric connects the at least one GaN transistor to the on-chip magnetic inductor.

16. A method of forming an integrated DC-DC power converter, the method comprising:
   forming at least one Si CMOS transistor on an Si CMOS chip;
   depositing a first dielectric on a front of the Si CMOS chip covering the at least one Si CMOS transistor;
   forming at least one GaN transistor on a GaN switch chip;
   depositing a second dielectric on a front of the GaN switch chip covering the at least one GaN transistor;
   forming an on-chip magnetic inductor on either the Si CMOS chip or on the GaN switch chip; and
   bonding the Si CMOS chip to the GaN switch chip with the front of the GaN switch chip facing the front of the Si CMOS chip, wherein the on-chip magnetic inductor is present in between the front of the GaN switch chip and the front of the Si CMOS chip.

17. The method of claim 16, further comprising:
   forming the on-chip magnetic inductor on the front of the Si CMOS chip.

18. The method of claim 16, further comprising:
   forming the on-chip magnetic inductor on the front of the GaN switch chip.

19. The method of claim 16, further comprising:
   bonding the Si CMOS chip to the GaN switch chip via a solder bond which creates a space between the front of the GaN switch chip and the front of the Si CMOS chip, and wherein the on-chip magnetic inductor is present within the space.

* * * * *